(12) United States Patent
Tan et al.

(10) Patent No.: US 8,283,193 B2
(45) Date of Patent: Oct. 9, 2012

(54) INTEGRATED CIRCUIT SYSTEM WITH SEALRING AND METHOD OF MANUFACTURE THEREOF

(75) Inventors: Soon Yoeng Tan, Singapore (SG); Teck Jung Tang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 429 days.

(21) Appl. No.: 12/541,373

(22) Filed: Aug. 14, 2009

(65) Prior Publication Data
US 2011/0037140 A1    Feb. 17, 2011

(51) Int. Cl.
*H01L 21/00* (2006.01)
(52) U.S. Cl. ............... 438/33; 438/68; 438/115
(58) Field of Classification Search ............ 438/33, 438/68, 115
See application file for complete search history.

(56) References Cited

U.S. PATENT DOCUMENTS

| | | | |
|---|---|---|---|
| 7,098,676 B2 | 8/2006 | Landers et al. | |
| 7,504,722 B2* | 3/2009 | Ochiai | 257/730 |
| 7,915,746 B2* | 3/2011 | Ohsumi | 257/790 |
| 7,943,426 B2* | 5/2011 | Hwan | 438/113 |
| 2005/0179213 A1* | 8/2005 | Huang et al. | 277/620 |
| 2006/0079024 A1* | 4/2006 | Akram | 438/110 |
| 2007/0045665 A1* | 3/2007 | Park | 257/204 |
| 2008/0299708 A1* | 12/2008 | Tsutsue | 438/121 |
| 2010/0140779 A1* | 6/2010 | Lin et al. | 257/690 |

* cited by examiner

*Primary Examiner* — James Mitchell
(74) *Attorney, Agent, or Firm* — Mikio Ishimaru; Stanley Chang

(57) ABSTRACT

A method of manufacture an integrated circuit system includes: forming an insulation region in a base layer; filling an insulator in the insulation region around a perimeter of a main chip region; forming a contact directly on and within planar extents of the insulator; and forming an upper layer over the contact to protect the main chip region.

20 Claims, 3 Drawing Sheets

INTEGRATED CIRCUIT SYSTEM WITH SEALRING AND METHOD OF MANUFACTURE THEREOF

TECHNICAL FIELD

The present invention relates generally to an integrated circuit system, and more particularly to a system for an integrated circuit system with sealring.

BACKGROUND ART

Electronics products include chips also known as semiconductor devices. A large number of the chips can typically be manufactured at the same time. A large number of the chips need to be separated or singulated before they can be used since each individual chip can be used in different products.

After semiconductor devices have been created over a substrate, independent operational units, also known as semiconductor dice, are created by singulating the substrate into individual units. This latter process is known as die dicing, a process that is frequently performed by sawing a wafer along die sawing paths that have been provided between and surrounding the semiconductor dice.

A sealring is designed in such a way that it provides a protection to the main chip by preventing cracks, delamination, and mobile ions from entering the main chip resulting from a wafer saw process. Mobile ions include moisture and oxidation components.

In many cases, the sealring is designed with a wider metal width than that permissible in the main chip with the aim to improve the effectiveness of the sealring and the sealring's toughness. However, wider metal width designs in crackstop have a higher tendency of causing arcing resulting from a reactive ion etching (RIE) process.

Thus, a need still remains for an integrated circuit system providing the sealring. In view of wafer yield and reliability, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: forming an insulation region in a base layer; filling an insulator in the insulation region around a perimeter of a main chip region; forming a contact directly on and within planar extents of the insulator; and forming an upper layer over the contact to protect the main chip region.

The present invention provides an integrated circuit system, including: an insulation region in a base layer; an insulator in the insulation region around a perimeter of a main chip region; a contact directly on and within planar extents of the insulator; and an upper layer over the contact to protect the main chip region.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
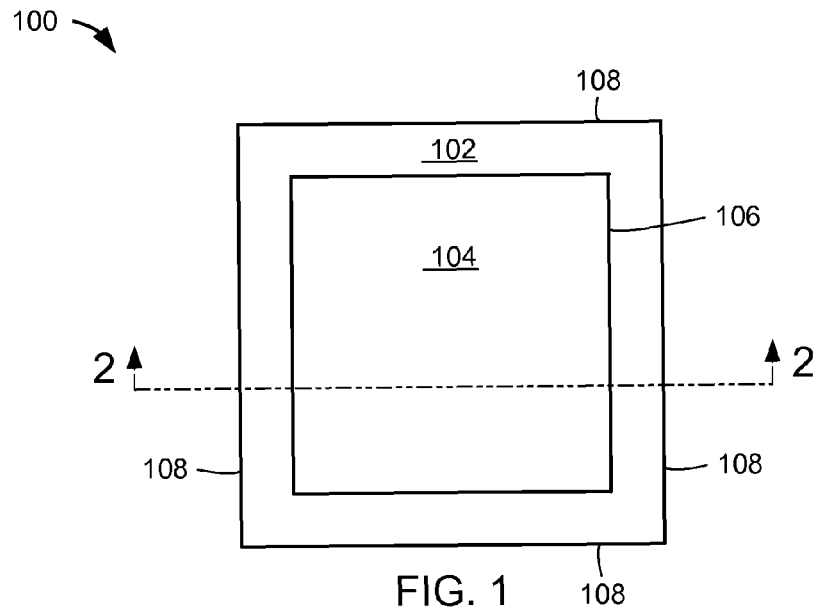
FIG. 1 is a top plan view of an integrated circuit system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top plan view of an integrated circuit system 100 in a first embodiment of the present invention. The top view is shown without a passivation layer.

The integrated circuit system 100 can include a sealring region 102, such as an area including a ring or a group of rings that surround and isolate an active surface area of a main chip region 104, such as a semiconductor core or an integrated circuit. The sealring region 102 can surround the main chip region 104 at a perimeter 106 of the main chip region 104. The sealring region 102 can provide protection to the main chip region 104 by providing a mechanical stress release buffer between die sawing paths 108 and the active surface area of the main chip region 104.

Figure 2:
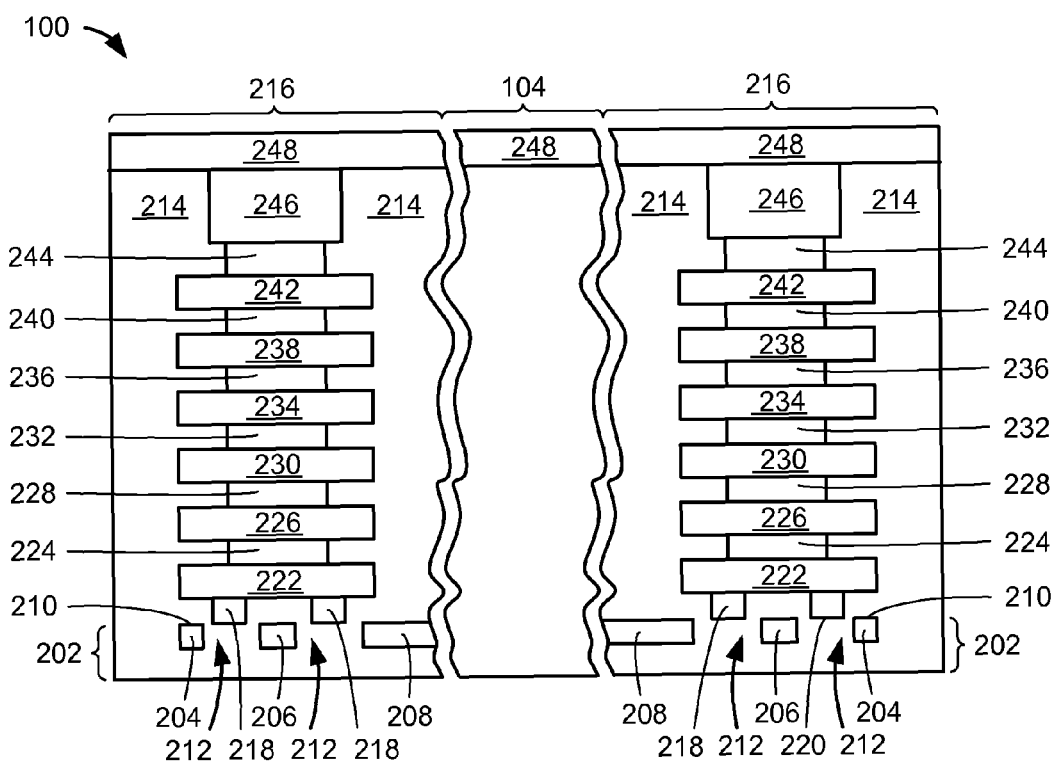
FIG. 2 is a cross-sectional plan view of the integrated circuit system along a section line 2-2 of FIG. 1.

Referring now to FIG. 2, therein is shown a cross-sectional plan view of the integrated circuit system 100 along a section line 2-2 of FIG. 1. The cross-sectional view is shown with the sealring region 102 of FIG. 1 along the perimeter 106 of FIG. 1. The sealring region 102 is preferably formed adjacent the main chip region 104, which can include a perimeter bond pad exposed for connectivity. On a side of the perimeter bond pad opposite the sealring region 102, the main chip region 104 can also include integrated circuits, channels, or vias for performing integrated circuit functions of the main chip region 104.

The integrated circuit system 100 can include a substrate (not shown), such as a silicon, a chip substrate, a die substrate, a semiconductor substrate, a metalized substrate, a glass substrate, or a semiconductor device mounting support. The substrate can include a ceramic substrate, a gallium arsenic substrate, a doped or undoped semiconductor, or an epitaxial layer of silicon supported by a base conductor. The substrate can also include a silicon substrate including a single layer of material, such as a silicon wafer or a material including a silicon on insulator (SOI) technology or a silicon on sapphire (SOS) technology.

The integrated circuit system 100 can include a base layer 202, such as a semiconductor or a layer formed in the substrate and doped with active ions including holes or electrons. For illustrative purposes, the base layer 202 is shown with five active portions, although there can be any number of the active portions.

The base layer 202 can include a plurality of the active portions including a first active portion 204, a second active portion 206, or a third active portion 208. The first active portion 204, the second active portion 206, or the third active portion 208 can include a portion of the layer formed in the substrate and doped with active ions including holes or electrons. Each of the first active portion 204, the second active portion 206, and the third active portion 208 can include a top side 210, which can include a side opposing a bottom side of the base layer 202.

The first active portion 204 can be formed at a side of the base layer 202. The base layer 202 can include an insulation region 212, which can include an area or a space in between adjacent active portions or other insulating structure such as a shallow trench isolation (STI).

The insulation region 212 can be formed by using an etching process. The insulation region 212 can be at least partially filled with an insulator 214, such as a dielectric, an insulating dielectric, a dielectric with a low dielectric constant (low-k), a silicon dioxide ($SiO_2$), a silica, or a silicate glass.

For illustrative purposes, the insulator 214 is formed of a common material having characteristics being formed from a single integral structure, although the integrated circuit system 100 can include the insulator 214 formed of different types of material. For example, the integrated circuit system 100 can include the insulator 214 formed of fluorinated silica glass (FSG), unfluorinated silica glass (USG), or oxide in upper insulating layers and low-k dielectric in lower insulating layers.

The first active portion 204 can be formed next to a side of the insulation region 212. The second active portion 206 can be formed next to another side of the insulation region 212. The second active portion 206 can be formed next to a side of another of the insulation region 212.

The integrated circuit system 100 can include a sealring 216, such as a ring that surrounds and isolates the active surface area of the main chip region 104. The integrated circuit system 100 can include any number of the sealring 216.

The sealring 216 can be formed over or on the first active portion 204, the second active portion 206, and the third active portion 208. The third active portion 208 can be formed under and between the sealring 216 and another of the sealring 216. The sealring 216 can be formed adjacent a side of the third active portion 208. Another of the sealring 216 can be formed adjacent another side of the third active portion 208.

The sealring 216 can include a contact 218, such as a post, a pillar, or a hole filled with a conductive material including copper (Cu), aluminum (Al), Magnesium (Mg), tungsten (W), or any metallic or non-metallic material. The contact 218 can be formed directly on and within planar extents of the insulator 214 in the insulation region 212 entirely around the perimeter 106 of the main chip region 104 to protect the main chip region 104. The contact 218 can be formed entirely on the insulator 214. For illustrative purposes, the sealring 216 is shown with two contacts, although the sealring 216 can include any number of the contact 218.

The contact 218 can be formed only between or not directly over the adjacent active portions. The contact 218 can be formed in a structure that is laterally non-overlapped with the adjacent active portions. The contact 218 can be electrically isolated from the adjacent active portions such as the first active portion 204.

The contact 218 can be formed only between or not directly over the adjacent active portions such as the first active portion 204. The contact 218 can be formed in a structure that is laterally non-overlapped with the adjacent active portions to provide a predetermined spacing for eliminating arcing in the RIE process.

The first active portion 204 can be formed adjacent a vertical side of the contact 218. The second active portion 206 can be formed adjacent another vertical side of the contact 218. The second active portion 206 can be formed adjacent a vertical side of another of the contact 218. The third active portion 208 can be formed adjacent another vertical side of the another of the contact 218. The first active portion 204, the second active portion 206, or the third active portion 208 can include a vertical side substantially parallel to a vertical side of the contact 218.

A plane of a bottom side 220 of the contact 218 can preferably be substantially aligned to a plane of the top side 210 of the first active portion 204, the second active portion 206, or the third active portion 208. Forming the contact 218 can preferably provide a spacing from the first active portion 204, the second active portion 206, or the third active portion 208. The contact 218 can be formed directly on the insulation region 212.

The sealring 216 can include a layer one 222, such as a conductor or a layer including a conductive material for providing a flow of electric charge. The layer one 222 can include preferably copper (Cu) or another material such as aluminum (Al), Magnesium (Mg), tungsten (W), or any metallic or non-metallic material.

The layer one 222 can be formed over an entire chip during a single deposition process. The layer one 222 can be deposited directly on or over the contact 218.

The sealring 216 can include a via one 224, such as a post, a pillar, or a hole filled with a conductive material for providing an electrical connection between adjacent conductive layers. The via one 224 can be formed by etching and filling with a conductive material, which can include preferably copper (Cu) or another material such as aluminum (Al), Magnesium (Mg), tungsten (W), or any metallic or non-metallic material. The via one 224 can be formed directly on or over the layer one 222.

The sealring 216 can include alternating layers and vias that are formed in an order of a layer two 226, a via two 228, a layer three 230, a via three 232, a layer four 234, a via four 236, a layer five 238, a via five 240, and a layer six 242. The alternating layers and vias can typically be similar to the layer one 222 and the via one 224, respectively.

The sealring 216 can be formed with the layer two 226 deposited directly on or over the via one 224, the via two 228 formed directly on or over the layer two 226, the layer three 230 deposited directly on or over the via two 228, and so on. The sealring 216 can include any number of the alternating layers and vias.

The sealring 216 can include an upper via 244, such as a post, a pillar, or a hole filled with a conductive material for providing an electrical connection between adjacent conductive layers. The upper via 244 can be formed by etching and filling with a conductive material, which can include preferably aluminum (Al) or another material such as copper (Cu), Magnesium (Mg), tungsten (W), or any metallic or non-metallic material. The upper via 244 can be formed directly on or over the layer six 242.

The sealring 216 can include an upper layer 246, such as a conductor or a layer including a conductive material for providing a flow of electric charge. The upper layer 246 can include preferably aluminum (Al) or another material such as copper (Cu), Magnesium (Mg), tungsten (W), or any metallic or non-metallic material. The upper layer 246 can include a predetermined width for improving effectiveness of the sealring 216.

The upper layer 246 can be formed over an entire chip during a single deposition process. The upper layer 246 can be deposited directly on or over the upper via 244.

The upper layer 246 can be formed with a thickness different than a thickness of other layers such as the layer one 222. For illustrative purposes, the thickness of the upper layer 246 is greater than the thickness of the other layers, although it may be any thickness.

The insulator 214 can be formed adjacent or surrounding the contact 218, the alternating layers and vias including the layer one 222, the via one 224, the layer two 226, the via two 228, the layer three 230, the via three 232, the layer four 234, the via four 236, the layer five 238, the via five 240, the layer six 242, the upper via 244, and the upper layer 246.

Via height and metal thickness can vary depending on design rules. An exemplary design rule can include 1×, 2×, 1.3×, 4×, 6×, 8×, 16×, etc. For example, if a 1× metal design rule is 50 nm line and 50 nm width, a 2× metal design rule is 100 nm line, 100 nm width, etc.

The integrated circuit system 100 can include a passivation layer 248, such as a surface passivation layer, a passivation layer including polyimide, or a layer including dielectric or silicon dioxide (SiO2). The passivation layer 248 can prevent contamination from occurring in the chip. The passivation layer 248 can also prevent delamination or separation of chip layers from spreading toward the active chip area. The passivation layer 248 can be deposited or formed on or over the upper layer 246 of the sealring 216.

It has been discovered that the present invention can eliminate arcing in the sealring 216 resulting from a reactive ion etching (RIE) process. Commonly, most of the sealrings are designed where contacts must land on active. The concept of "contact must land on active" creates a conducting path within a body of the sealring 216 from the layer six 242 or the upper layer 246 to the substrate (e.g. silicon (Si)). The conducting path induces arcing resulting from the RIE process. The present invention breaks the conducting path by making the contact 218 land on the insulation region 212 entirely around the perimeter 106 of the main chip region 104, thereby protecting the main chip region 104.

Figure 3:
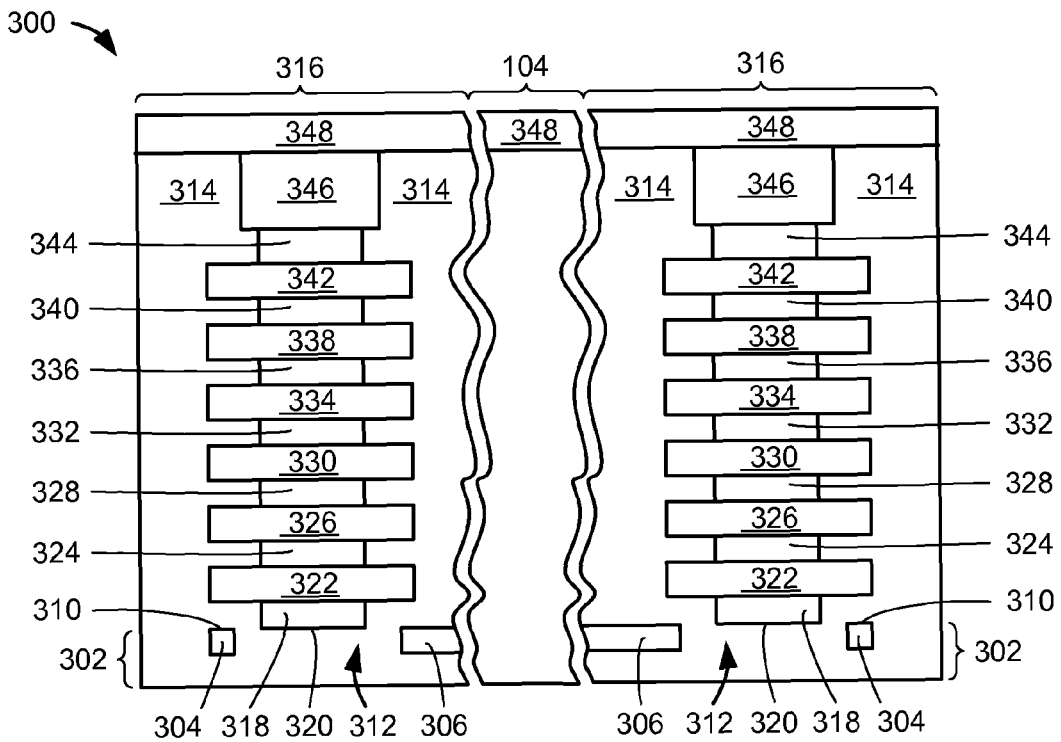
FIG. 3 is a cross-sectional plan view of an integrated circuit system in a second embodiment of the present invention.

Referring now to FIG. 3, therein is shown a cross-sectional plan view of an integrated circuit system 300 in a second embodiment of the present invention. The cross-sectional view is shown with a sealring region that can be similar to the sealring region 102 of FIG. 1 along the perimeter 106 of FIG. 1. The sealring region 102 is preferably formed adjacent the main chip region 104, which can include a perimeter bond pad exposed for connectivity. On a side of the perimeter bond pad opposite the sealring region 102, the main chip region 104 can also include integrated circuits, channels, or vias for performing integrated circuit functions of the main chip region 104.

The integrated circuit system 300 can include a substrate (not shown), such as a silicon, a chip substrate, a die substrate, a semiconductor substrate, a metalized substrate, a glass substrate, or a semiconductor device mounting support. The substrate can include a ceramic substrate, a gallium arsenic substrate, a doped or undoped semiconductor, or an epitaxial layer of silicon supported by a base conductor. The substrate can also include a silicon substrate including a single layer of material, such as a silicon wafer or a material including a silicon on insulator (SOI) technology or a silicon on sapphire (SOS) technology.

The integrated circuit system 300 can include a base layer 302, such as a semiconductor or a layer formed in the substrate and doped with active ions including holes or electrons. For illustrative purposes, the base layer 302 is shown with two active portions, although there can be any number of the active portions.

The base layer 302 can include a plurality of the active portions including a first active portion 304 or a second active portion 306. The first active portion 304 or the second active portion 306 can include a portion of the layer formed in the substrate and doped with active ions including holes or electrons. Each of the first active portion 304 and the second active portion 306 can include a top side 310, which can include a side opposing a bottom side of the base layer 302.

The first active portion 304 can be formed at a side of the base layer 302. The base layer 302 can include an insulation region 312, which can include an area or a space in between adjacent active portions or other insulating structure such as a shallow trench isolation (STI).

The insulation region 312 can be formed by using an etching process. The insulation region 312 can be at least partially filled with an insulator 314, such as a dielectric, an insulating dielectric, a dielectric with a low dielectric constant (low-k), a silicon dioxide ($SiO_2$), a silica, or a silicate glass.

For illustrative purposes, the insulator 314 is formed of a common material having characteristics being formed from a single integral structure, although the integrated circuit system 300 can include the insulator 314 formed of different types of material. For example, the integrated circuit system 300 can include the insulator 314 formed of fluorinated silica glass (FSG), unfluorinated silica glass (USG), or oxide in upper insulating layers and low-k dielectric in lower insulating layers.

The first active portion 304 can be formed next to a side of the insulation region 312. The second active portion 306 can be formed next to another side of the insulation region 312.

The integrated circuit system 300 can include a sealring 316, such as a ring that surrounds and isolates the active surface area of the main chip region 104. The integrated circuit system 300 can include any number of the sealring 316.

The sealring 316 can be formed over or on the first active portion 304 and the second active portion 306. The second active portion 306 can be formed under and between the sealring 316 and another of the sealring 316. The sealring 316 can be formed adjacent a side of the second active portion 306. Another of the sealring 316 can be formed adjacent another side of the second active portion 306.

The sealring 316 can include a contact 318, such as a post, a pillar, or a hole, filled with a conductive material including copper (Cu), aluminum (Al), Magnesium (Mg), tungsten (W), or any metallic or non-metallic material. The contact 318 can be formed directly on and within planar extents of the insulator 314 in the insulation region 312 entirely around the perimeter 106 of the main chip region 104 to protect the main chip region 104. The contact 318 can be formed entirely on the insulator 314. For illustrative purposes, the sealring 316 is shown with one contact, although the sealring 316 can include any number of the contact 318.

The contact 318 can be formed only between or not directly over the adjacent active portions. The contact 318 can be formed in a structure that is laterally non-overlapped with the adjacent active portions. The contact 318 can be electrically isolated from the adjacent active portions such as the first active portion 304.

The contact 318 can be formed only between or not directly over the adjacent active portions such as the first active portion 304. The contact 318 can be formed in a structure that is laterally non-overlapped with the adjacent active portions to provide a predetermined spacing for eliminating arcing in the RIE process.

The first active portion 304 can be formed adjacent a vertical side of the contact 318. The second active portion 306 can be formed adjacent another vertical side of the contact 318. The first active portion 304 or the second active portion 306 can include a vertical side substantially parallel to a vertical side of the contact 318.

A plane of a bottom side 320 of the contact 318 can preferably be substantially aligned to a plane of the top side 310 of the first active portion 304 or the second active portion 306. Forming the contact 318 can preferably provide a spacing from the first active portion 304 or the second active portion 306. The contact 318 can be formed directly on the insulation region 312.

The sealring 316 can include a layer one 322, such as a conductor or a layer including a conductive material for providing a flow of electric charge. The layer one 322 can include preferably copper (Cu) or another material such as aluminum (Al), Magnesium (Mg), tungsten (W), or any metallic or non-metallic material.

The layer one 322 can be formed over an entire chip during a single deposition process. The layer one 322 can be deposited directly on or over the contact 318.

The sealring 316 can include a via one 324, such as a post, a pillar, or a hole filled with a conductive material for providing an electrical connection between adjacent conductive layers. The via one 324 can be formed by etching and filling with a conductive material, which can include preferably copper (Cu) or another material such as aluminum (Al), Magnesium (Mg), tungsten (W), or any metallic or non-metallic material. The via one 324 can be formed directly on or over the layer one 322.

The sealring 316 can include alternating layers and vias that are formed in an order of a layer two 326, a via two 328, a layer three 330, a via three 332, a layer four 334, a via four 336, a layer five 338, a via five 340, and a layer six 342. The alternating layers and vias can typically be similar to the layer one 322 and the via one 324, respectively.

The sealring 316 can be formed with the layer two 326 deposited directly on or over the via one 324, the via two 328 formed directly on or over the layer two 326, the layer three 330 deposited directly on or over the via two 328, and so on. The sealring 316 can include any number of the alternating layers and vias.

The sealring 316 can include an upper via 344, such as a post, a pillar, or a hole filled with a conductive material for providing an electrical connection between adjacent conductive layers. The upper via 344 can be formed by etching and filling with a conductive material, which can include preferably aluminum (Al) or another material such as copper (Cu), Magnesium (Mg), tungsten (W), or any metallic or non-metallic material. The upper via 344 can be formed directly on or over the layer six 342.

The sealring 316 can include an upper layer 346, such as a conductor or a layer including a conductive material for providing a flow of electric charge. The upper layer 346 can include preferably aluminum (Al) or another material such as copper (Cu), Magnesium (Mg), tungsten (W), or any metallic or non-metallic material. The upper layer 346 can include a predetermined width for improving effectiveness of the sealring 316.

The upper layer 346 can be formed over an entire chip during a single deposition process. The upper layer 346 can be deposited directly on or over the upper via 344.

The upper layer 346 can be formed with a thickness different than a thickness of other layers such as the layer one 322. For illustrative purposes, the thickness of the upper layer 346 is greater than the thickness of the other layers, although it may be any thickness.

The insulator 314 can be formed adjacent or surrounding the contact 318, the alternating layers and vias including the layer one 322, the via one 324, the layer two 326, the via two 328, the layer three 330, the via three 332, the layer four 334, the via four 336, the layer five 338, the via five 340, the layer six 342, the upper via 344, and the upper layer 346. The contact 318 can include a horizontal dimension or a width that is similar to a horizontal dimension or a width of the via one 324, the via two 328, the via three 332, the via four 336, the via five 340, or the upper via 344.

Via height and metal thickness can vary depending on design rules. An exemplary design rule can include 1×, 2×, 1.3×, 4×, 6×, 8×, 16×, etc. For example, if a 1× metal design rule is 50 nm line and 50 nm width, a 2× metal design rule is 100 nm line, 100 nm width, etc.

The integrated circuit system 300 can include a passivation layer 348, such as a surface passivation layer, a passivation layer including polyimide, or a layer including dielectric or silicon dioxide (SiO2). The passivation layer 348 can prevent contamination from occurring in the chip. The passivation layer 348 can also prevent delamination or separation of chip layers from spreading toward the active chip area. The passivation layer 348 can be deposited or formed on or over the upper layer 346 of the sealring 316.

Figure 4:
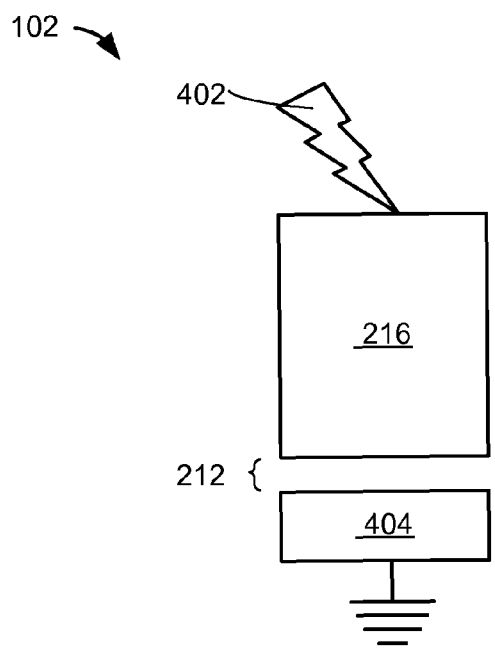
FIG. 4 is a conductive model of the sealring region.

Referring now to FIG. 4, therein is shown a conductive model of the sealring region 102. The sealring region 102 can include the sealring 216. For illustrative purposes, the sealring region 102 includes two sealrings.

As a result of the RIE process, static electricity 402 (or charge) can build up and apply to the sealring 216. The sealring 216 can include the contact 218 of FIG. 2 formed directly over the insulation region 212.

The insulation region 212 can be formed by using an etching process. The insulation region 212 can be filled with the insulator 214 of FIG. 2. The insulation region 212 can be formed over or on a substrate 404 or a doped portion of the substrate 404. The substrate 404 can be connected to ground.

The sealring 216 having the contact 218 of FIG. 2 formed directly over the insulation region 212 eliminates the conducting path for the static electricity 402 in the sealring 216. By eliminating the conducting path, RIE arcing can be eliminated.

Figure 5:
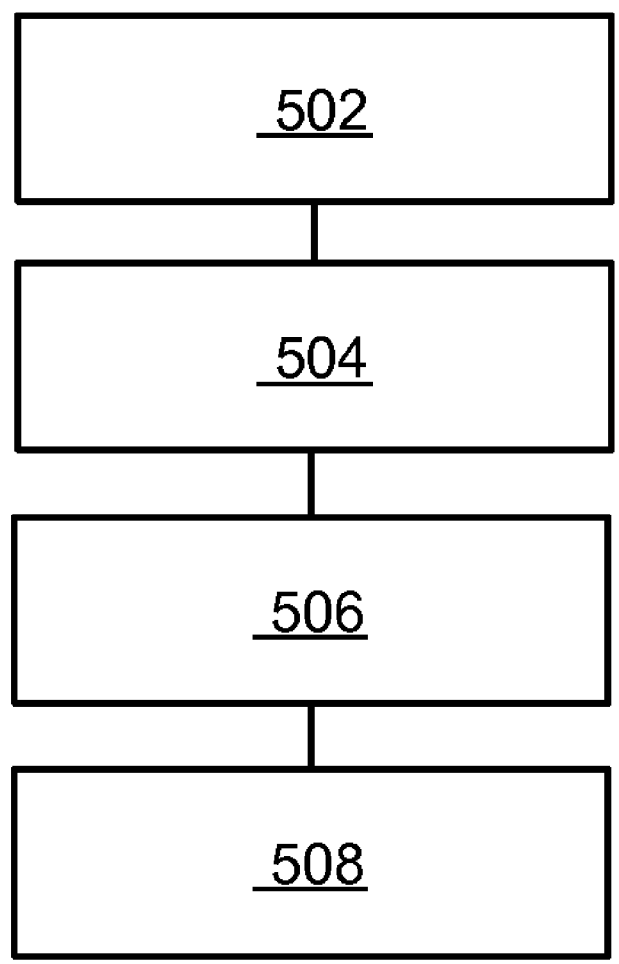
FIG. 5 is a flow chart of a method of manufacture of an integrated circuit system in a further embodiment of the present invention.

Referring now to FIG. 5, therein is shown a flow chart of a method 500 of manufacture of an integrated circuit system in a further embodiment of the present invention. The method 500 includes: forming an insulation region in a base layer in a block 502; filling an insulator in the insulation region around a perimeter of a main chip region in a block 504; forming a contact directly on and within planar extents of the insulator in a block 506; and forming an upper layer over the contact to protect the main chip region in a block 508.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
   forming an insulation region in a base layer;
   filling an insulator in the insulation region wherein the insulator is over an active portion and around a perimeter of a main chip region including an integrated circuit;
   forming a contact directly on and within planar extents of the insulator in the insulation region; and
   forming at least one sealring having an upper layer over active portion and the contact with the sealring surrounding and isolating an active surface area in the main chip region.

2. The method as claimed in claim 1 further comprising:
   forming a first active portion next to a side of the insulation region; and
   forming a second active portion next to another side of the insulation region.

3. The method as claimed in claim 1 further comprising:
   forming a first active portion adjacent a vertical side of the contact; and
   forming a second active portion adjacent another vertical side of the contact.

4. The method as claimed in claim 1 further comprising forming a first active portion adjacent the insulation region, the first active portion having a plane of a top side substantially aligned to a plane of a bottom side of the contact.

5. The method as claimed in claim 1 further comprising:
   forming an active portion adjacent the insulation region and wherein forming at least one of the sealring includes:
   forming a sealring adjacent the side of the active portion; and
   forming another of the sealring adjacent another side of the active portion.

6. A method of manufacture of an integrated circuit system comprising:
   forming an insulation region and a first active portion in a base layer, the insulation region adjacent the first active portion;
   filling an insulator in the insulation region wherein the insulator is entirely around a perimeter of a main chip region including an integrated circuit;
   forming a contact directly on and within planar extents of the insulator in the insulation region;
   forming a layer one directly on the contact;
   forming an upper via over the layer one;
   forming at least one sealring having an upper layer directly on the upper via with the sealring surrounding and isolating an active surface area in the main chip region; and
   forming a passivation layer directly on the upper layer.

7. The method as claimed in claim 6 wherein:
   forming the first active portion includes forming the first active portion next to a side of the insulation region, the first active portion having a spacing from the contact; and
further comprising:
   forming a second active portion next to another side of the insulation region, the second active portion having a spacing from the contact.

8. The method as claimed in claim 6 wherein:
   forming the first active portion includes forming the first active portion adjacent the contact, the first active portion having a vertical side substantially parallel to a vertical side of the contact; and
further comprising:
   forming a second active portion adjacent the contact, the second active portion having a vertical side substantially parallel to another vertical side of the contact.

9. The method as claimed in claim 6 wherein forming the first active portion includes forming the first active portion adjacent the contact, the first active portion having a plane of a top side substantially aligned to a plane of a bottom side of the contact.

10. The method as claimed in claim 6 further comprising forming an active portion adjacent the insulation region formed as a shallow trench isolation, the active portion having a side adjacent the sealring and another side adjacent another of the sealring.

11. An integrated circuit system comprising:
   an insulation region in a base layer;
   an insulator in the insulation region wherein the insulator is over an active portion and around a perimeter of a main chip region including an integrated circuit;

a contact directly on and within planar extents of the insulator in the insulation region; and at least one sealring having an upper layer over the contact with the sealring surrounding and isolating an active surface area in the main chip region.

12. The system as claimed in claim 11 further comprising:

a first active portion next to a side of the insulation region; and a second active portion next to another side of the insulation region.

13. The system as claimed in claim 11 further comprising:

a first active portion adjacent a vertical side of the contact; and a second active portion adjacent another vertical side of the contact.

14. The system as claimed in claim 11 further comprising a first active portion adjacent the insulation region, the first active portion having a plane of a top side substantially aligned to a plane of a bottom side of the contact.

15. The system as claimed in claim 11 further comprising:

an active portion adjacent the insulation region; and wherein at least one of the sealring includes:

the sealring adjacent a side of the active portion; and another of the sealring adjacent another side of the active portion.

16. The system as claimed in claim 11 further comprising:

a first active portion in the base layer, the insulation region adjacent the first active portion and entirely around the perimeter of the main chip region;

a layer one directly on the contact;

an upper via over the layer one; and a passivation layer directly on the upper layer, the upper layer directly on the upper via.

17. The system as claimed in claim 16 wherein:

the first active portion includes the first active portion next to a side of the insulation region, the first active portion having a spacing from the contact; and further comprising:

a second active portion next to another side of the insulation region, the second active portion having a spacing from the contact.

18. The system as claimed in claim 16 wherein:

the first active portion includes the first active portion adjacent the contact, the first active portion having a vertical side substantially parallel to a vertical side of the contact; and further comprising:

a second active portion adjacent the contact, the second active portion having a vertical side substantially parallel to another vertical side of the contact.

19. The system as claimed in claim 16 wherein the first active portion includes the first active portion adjacent the contact, the first active portion having a plane of a top side substantially aligned to a plane of a bottom side of the contact.

20. The system as claimed in claim 16 further comprising an active portion adjacent the insulation region formed as a shallow trench isolation, the active portion having a side adjacent the sealring and another side adjacent another of the sealring.

* * * * *